US007236064B2

(12) United States Patent
Lee et al.

(10) Patent No.: US 7,236,064 B2
(45) Date of Patent: Jun. 26, 2007

(54) LAMINATED BALUN TRANSFORMER

(75) Inventors: Byoung Hwa Lee, Sungnam (KR); Dong Seok Park, Seoul (KR); Min Cheol Park, Anyang (KR); Sang Soo Park, Suwon (KR)

(73) Assignee: Samsung Electro-Mechanics Co. Ltd., Suwon, Kyungki-Do (KR)

( * ) Notice: Subject to any disclaimer, the term of this patent is extended or adjusted under 35 U.S.C. 154(b) by 78 days.

(21) Appl. No.: 11/067,872

(22) Filed: Feb. 28, 2005

(65) Prior Publication Data

US 2006/0061430 A1 Mar. 23, 2006

(30) Foreign Application Priority Data

Sep. 23, 2004 (KR) ...................... 10-2004-0076302

(51) Int. Cl.
*H03H 7/42* (2006.01)
*H01P 5/10* (2006.01)

(52) U.S. Cl. ........................................ 333/26; 333/238

(58) Field of Classification Search .................. 333/25, 333/26, 238
See application file for complete search history.

(56) References Cited

U.S. PATENT DOCUMENTS 6,768,410 B1 7/2004 Yazaki et al. ............... 336/200
6,954,116 B2 * 10/2005 Nosaka ........................ 333/26

FOREIGN PATENT DOCUMENTS

| | | | |
|---|---|---|---|
| JP | 5-11645 | A | 3/1993 |
| JP | 5-21986 | A | 6/1993 |
| JP | 05-323101 | A | 12/1993 |
| JP | 09-043285 | A | 2/1997 |
| JP | 11-219824 | A | 8/1999 |
| JP | 2002-190413 | A | 7/2002 |
| JP | P 2003-110314 | A * | 4/2003 |
| JP | 2003-198221 | A | 7/2003 |
| WO | WO 01/33631 | A1 | 5/2001 |

* cited by examiner

*Primary Examiner*—Dean Takaoka
(74) *Attorney, Agent, or Firm*—Volpe and Koenig P.C.

(57) ABSTRACT

The present invention relates a laminated balun transformer with an improved insertion loss characteristic in a pass band. The laminated balun transformer includes a first strip line and a third strip line form one coupler, a second strip line and a fourth strip line form another coupler, and a conductive non-ground electrode formed at an intermediate position between the third strip line and the fourth strip line. The non-ground electrode forms a ground by electromagnetic coupling between the third strip line and the fourth strip line. With the configuration, insertion loss in an operation band is reduced. In addition, by implementing an impedance and an electromagnetic shield using a ground pattern of a mount surface without separately forming an internal ground electrode on the bottom layer of a dielectric block, of ground electrodes formed above and below the first to fourth strip lines for the electromagnetic shield from the outside, the thickness of the laminated balun transformer can be reduced without any deterioration of characteristic of the transformer.

9 Claims, 5 Drawing Sheets

LAMINATED BALUN TRANSFORMER

RELATED APPLICATION

The present invention is based on, and claims priority from, Korean Application Number 2004-76302, filed Sep. 23, 2004, the disclosure of which is incorporated by reference herein in its entirety.

BACKGROUND OF THE INVENTION

1. Field of the Invention

The present invention relates to a laminated balun transformer, and more particularly, to a subminiaturized laminated balun transformer with an improved insertion loss characteristic in a pass band.

2. Description of the Related Art

The term "balun" in balun transformer, which is an abbreviation for balanced to unbalanced, refers to a device composed of a circuit or structure for transforming a balanced signal to an unbalanced signal and vice versa. For example, this is required to perform a transformation between a balanced signal and an unbalanced signal when a device having a balanced input/output stage, such as a mixer or an amplifier, is connected to a device having an unbalanced input/output stage, such as an antenna.

The balun transformer can be implemented by a combination of lumped elements such as R, L, and C elements, or distributed elements such as a microstrip line, a strip line and a transmission line. Recently, with the increasing need for miniaturization of radio communication products widely employing the balun transformer, a laminated balun transformer using low temperature cofired ceramics (LTCC) is being frequently used to reduce the size of the elements.

FIG. 1 is an equivalent circuit showing the basic configuration of a general balun transformer as suggested by Marchand. As shown in this figure, the balun transformer is composed of four conductive lines 14 to 17 each having a length of λ/4 (where, λ is 1/fc (fc is the center frequency of an input/output signal)). Of the four conductive lines 14 and 17, a first line 14 has one end connected to an unbalanced port 11 through which an unbalanced signal having a certain frequency is inputted or outputted. A second line 15 has one end connected to the other end of the first line 14. The other end of the second strip line 15 is opened. In addition, a third line 16 and a fourth line 17 each have one respective one end thereof connected to a ground point and are arranged in parallel with the first line 14 and the second line 15, respectively, to form an electrical coupling therebetween. The other ends of the third and fourth lines 16 and 17 are connected respectively to balanced ports 12 and 13 through which a balance signal is inputted or outputted.

In the above configuration, the first line 14 and the third line 16 form one coupler and the second line 15 and the fourth line 17 form another coupler. With the above configuration, when an unbalanced signal having a certain frequency is inputted to the unbalanced port 11, electromagnetic coupling among the first to fourth lines 14 to 17 is generated, and accordingly, the balanced signal having the same frequency and magnitude as the inputted unbalanced signal, but having a phase which is different by 180 degrees from the phase of the unbalanced signal, is outputted through the balanced ports 12 and 13. On the contrary, when two balanced signals having a certain frequency, the same magnitude, and phases, which are different by 180 degrees from each other, are respectively inputted to the balanced ports 12 and 13, an unbalanced signal having the same frequency as the two inputted balanced signals are outputted through the unbalanced port 11.

A conventional laminated balun transformer having such an equivalent circuit is implemented with a shape as shown in FIG. 2 and an internal structure as shown in FIG. 3.

Referring to FIG. 2, the conventional laminated balun transformer 20 is composed of a rectangular hexahedral dielectric block 21 and a plurality of external electrodes 23 to 28 formed on two opposite sides of the dielectric block 21, each of which is set as a terminal such as an unbalanced terminal, a balanced terminal, or a ground terminal. For example, an external electrode 3 is set as a terminal for non-connection, external electrodes 24 and 27 are set as a terminal for a ground, external electrodes 25 and 28 are set as a terminal for input/output of a balanced signal, and an external electrode 26 is set as a terminal for input/output of an unbalanced signal.

Referring to FIG. 3, the dielectric block 21 is composed of a plurality of dielectric sheets laminated using an LTCC method. On the plurality of laminated dielectric sheets are formed a first ground electrode 30 connected to the external electrodes 24 and 27 for a ground, the first strip line 32 having a length of λ/4 and having one end connected to the external electrode 26 for input/output of the unbalanced signal, the third strip line 33 formed in parallel with the first strip line 32, having a length of λ/4 and having both ends connected respectively to the external electrode 25 for input/output of the balanced signal and the external electrode 27 for a ground, a second ground electrode 35 connected to the external electrodes 24 and 27 for a ground, the second strip line 37 having a length of λ/4 and having one end connected to the first strip line 32 via the external electrode 23 and the other end opened, the fourth strip line 38 formed in parallel with the second strip line 37 and having both ends connected respectively to the external electrode 27 for a ground and the external electrode 28 for input/output of the balanced signal, and a third ground electrode 40 connected to the external electrodes 24 and 27 for a ground, sequentially in a downward direction.

Reference numerals 31, 34, 36 and 39, which are not described, denote lead electrodes for connecting the first to fourth strip lines 32, 33, 37 and 38 to respective external electrodes 23 to 28.

As described above, the laminated balun transformer is miniaturized by vertically laminating four λ/4 strip lines. However, recently, with the increased need for a subminiaturized balun transformer, much study has been concentrated on the subminiaturization of the balun transformer while maintaining or improving its basic properties.

SUMMARY OF THE INVENTION

Therefore, the present invention has been made in light of the above described circumstance, and it is an object of the present invention to provide a subminiaturized laminated balun transformer with an improved insertion loss characteristic in a pass band.

In accordance with an aspect of the present invention, the above and other objects can be accomplished by the provision of a laminated balun transformer including a dielectric block formed by laminating a plurality of dielectric sheets, and a plurality of external electrodes formed on the outer sides of the dielectric block, for transforming a balanced signal into an unbalanced signal and vice versa, the plurality of external electrodes being used for a ground, input/output of the unbalanced signal, input/output of first and second balanced signals, and non-connection, wherein the dielectric block includes an internal ground electrode formed on a lower layer spaced apart by a certain distance from the top layer of the dielectric block, the internal ground electrode being connected to the external electrode for a ground; a first strip line formed on a lower layer below the internal ground electrode and having one end connected to the external electrode for input/output of the unbalanced signal; a second strip line formed on a lower layer below the internal ground electrode and having one end connected to the other end of the first strip line, the other end of the second strip line being opened; a third strip line formed in parallel with the first strip line on a lower layer below the internal ground electrode and having one end connected to the external electrode for a ground and the other end connected to the external electrode for input/output of the first balanced signal; and a fourth strip line formed in parallel with the second strip line on a lower layer below the internal ground electrode and having one end connected to the external electrode for a ground and the other end connected to the external electrode for input/output of the second balanced signal, and wherein the bottom layer of the dielectric block is mounted on a ground pattern of a substrate.

Preferably, the first strip line is formed on the same layer as the second strip line, and the third strip line and the fourth strip line are formed on the same layer under or above the first and second strip lines.

Preferably, the first to fourth strip lines have a spiral or meandering shape to reduce the size of the balun transformer.

Preferably, the first to fourth strip lines are formed on different layers in the dielectric block. In this case, the dielectric block further includes a non-ground electrode made of a conductive metal material and formed on a layer between the first and third strip lines and the second and fourth strip lines in parallel with each other for forming an electrical shielding between the first and third strip lines and the second and fourth strip lines.

In accordance with another aspect of the present invention, the above and other objects can be accomplished by the provision of a laminated balun transformer including a dielectric block formed by laminating a plurality of dielectric sheets, and a plurality of external electrodes formed on the outer sides of the dielectric block, the plurality of external electrodes being used for a ground, input/output of the unbalanced signal, input/output of first and second balanced signals, and non-connection, wherein the dielectric block includes an internal ground electrode formed on a lower layer spaced apart by a certain distance from the top layer of the dielectric block, the internal ground electrode being connected to the external electrode for a ground and formed to shield electric coupling in an upward direction; a first strip line formed on a lower layer below the internal ground electrode and having both ends connected respectively to the external electrode for non-ground and the external electrode for input/output of the unbalanced signal; a third strip line formed in parallel with the first strip line on an adjacent layer above or under the first strip line in a downward direction of the internal ground electrode and having both ends connected respectively to the external electrode for a ground and the external electrode for input/output of the first balanced signal; a second strip line formed on a lower layer below the internal ground electrode and having one end connected to the external electrode for non-ground and the other end opened; a fourth strip line formed in parallel with the second strip line on a layer adjacent to the second strip line below the internal ground electrode of the dielectric block and having both ends connected respectively to the external electrode for a ground and the external electrode for input/output of the second balanced signal; and a non-ground electrode formed on a dielectric sheet between the first and third strip lines and the second and fourth strip lines to shield electric coupling therebetween.

Preferably, the dielectric block further includes a first lead electrode for connecting the first strip line to the external electrode for non-connection, the first lead electrode being formed on an internal layer of the dielectric block and having one end connected to the external electrode for non-connection and the other end electrically connected to one end of the first strip line through a via hole; a second lead electrode for connecting the third strip line to the external electrode for input/output of the balanced signals, the second lead electrode being formed on an internal layer of the dielectric block and having one end electrically connected to the third strip line through a via hole and the other end connected to the external electrode for input/output of the balanced signals; a third lead electrode for connecting the second strip line to the external electrode for non-connection, the third lead electrode being formed on an internal layer of the dielectric block and having one end electrically connected to the second strip line through a via hole and the other end connected to the external electrode for input/output of the balanced signals; and a fourth lead electrode for connecting the fourth strip line to the external electrode for input/output of the second balanced signal, the fourth lead electrode being formed on an internal layer of the dielectric block and having one end electrically connected to the fourth strip line through a via hole and the other end connected to the external electrode for input/output of the second balanced signal.

Preferably, the bottom layer of the dielectric block is bonded to a ground pattern of a substrate to be used as a bottom ground electrode.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the accompanying drawings. In the description and the drawings, illustrations of elements having no relation with the present invention are omitted in order to prevent the subject matter of the present invention from being unclear.

As described above, the laminated balun transformer of the present invention is characterized in that the size thereof is reduced and the characteristics thereof are improved by modifying a ground electrode formed for electrical shielding and impedance matching between signal lines, instead of modifying a connection structure or arrangement of the signal lines.

Figure 1:
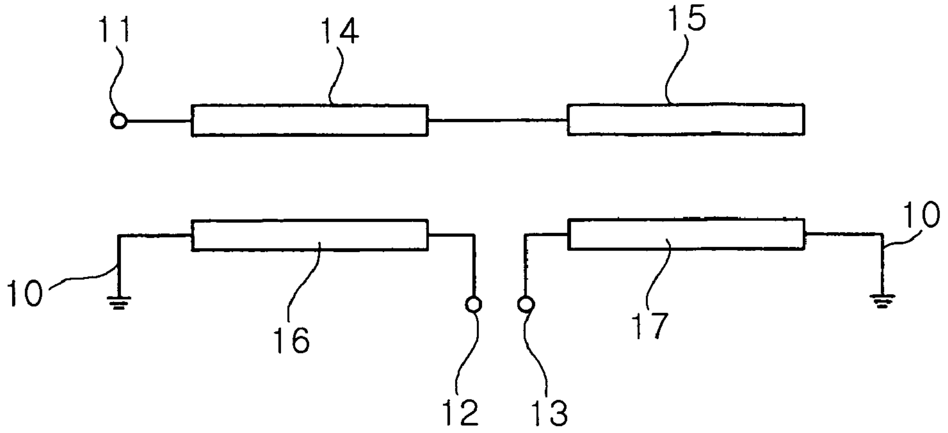
Prior art FIG. 1
FIG. 1 is an equivalent circuit of a general balun transformer.
Figure 2:
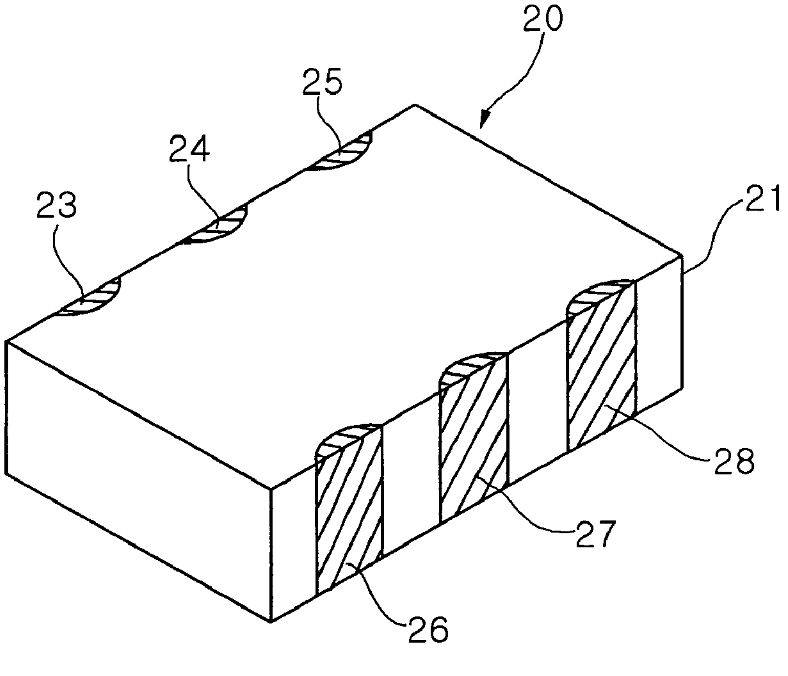
Prior art FIG. 2
FIG. 2 is a perspective view showing a shape of a conventional laminated balun transformer.

Hereinafter, the balun transformer represented by the equivalent circuit as shown in FIG. 1 will be described as one example.

Figure 4:
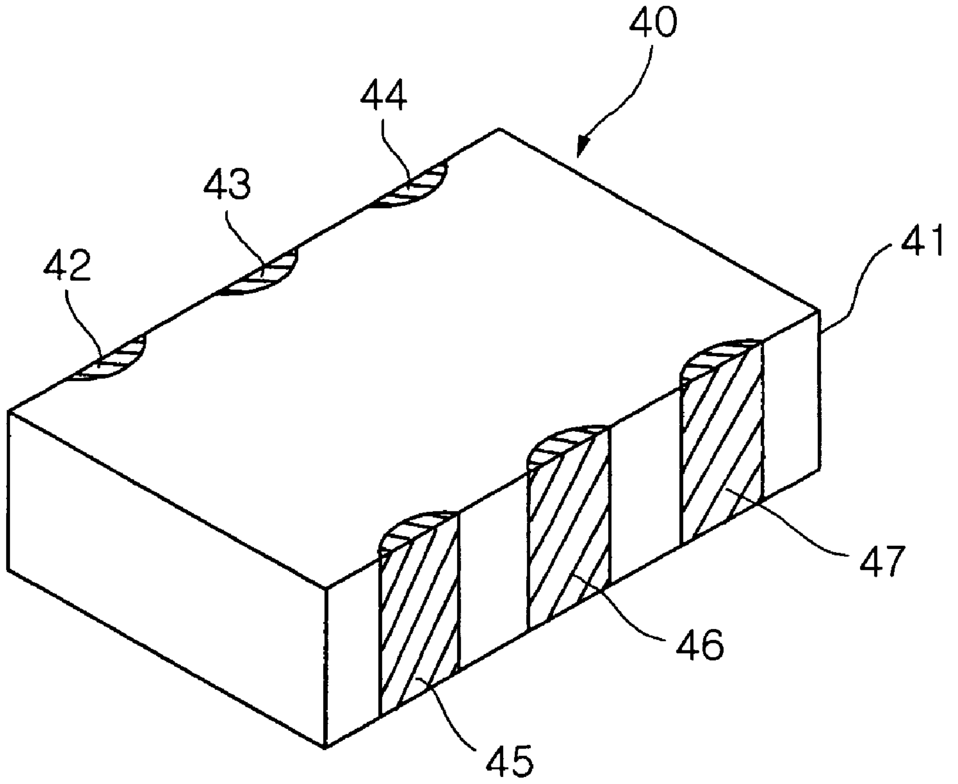
FIG. 4 is a perspective view showing the shape of a laminated balun transformer according to the present invention.

FIG. 4 is a perspective view showing the shape of a laminated balun transformer according to the present invention.

Referring to FIG. 4, the laminated balun transformer 40 of the present invention is composed of a rectangular hexahedral dielectric block 41 formed by a plurality of dielectric sheets laminated by an LTCC method, and a plurality of external electrodes 42 to 47 formed on two opposite sides of the dielectric block 41, each of which is set for a ground, input/output of an unbalanced signal, input/output of a balanced signal, etc. Such a shape is the same as the conventional laminated balun transformer. Accordingly, the laminated balun transformer of the present invention has the same shape as the conventional laminated balun transformer without an increase in the number of external electrodes or a modification of arrangement or structure. This gives a user a convenience in the design and arrangement aspect of the laminated balun transformer. In this embodiment, the external electrode 42 is set for non-connection, the external electrodes 43 and 46 are set for a ground, the external electrodes 44 and 47 are set for input/output of first and second balanced signal, respectively, and the external electrode 45 is set for input/output of the unbalanced signal.

Figure 5:
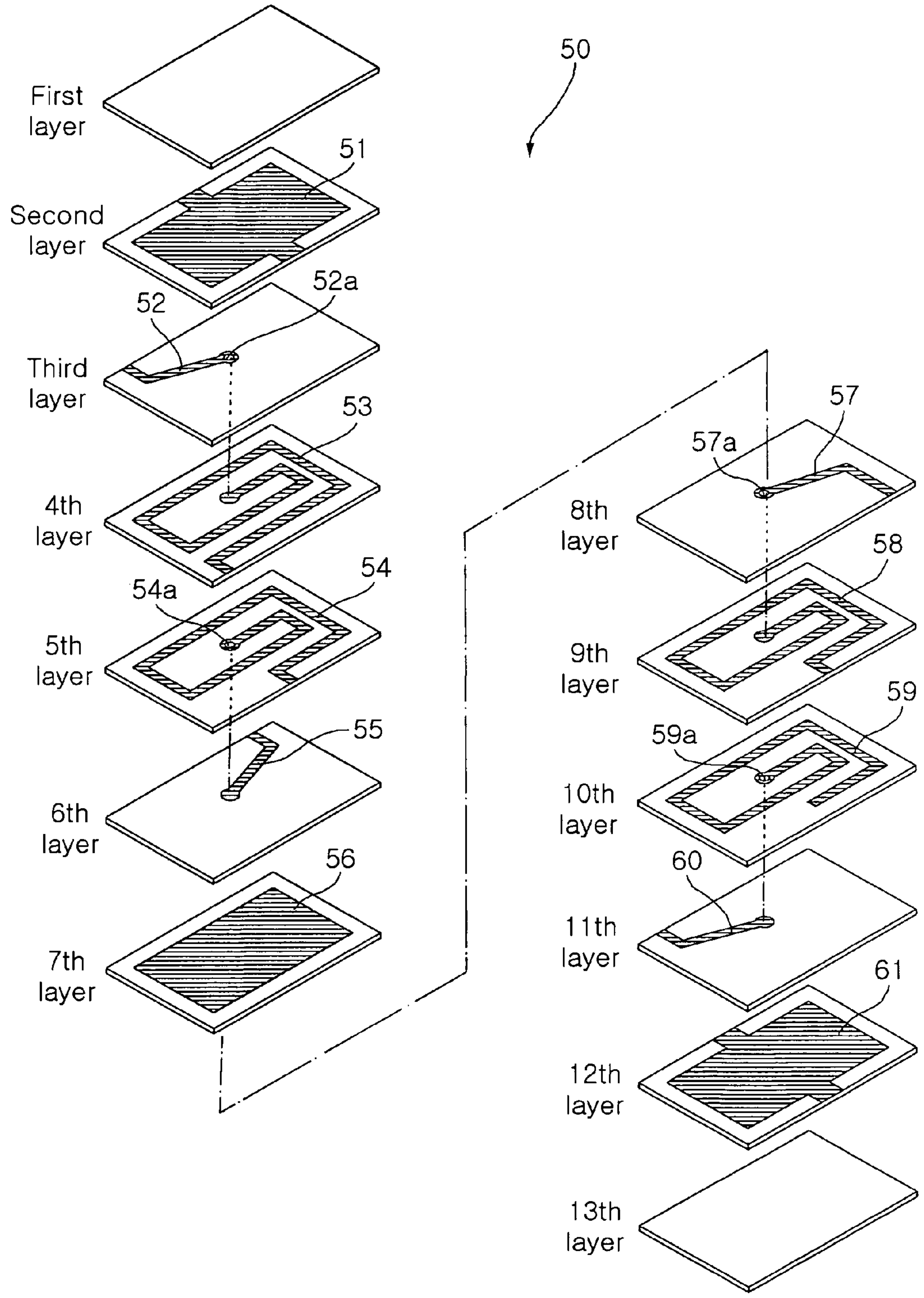
FIG. 5 is an exploded perspective view illustrating a laminated balun transformer according to a first embodiment of the present invention.
Figure 6:
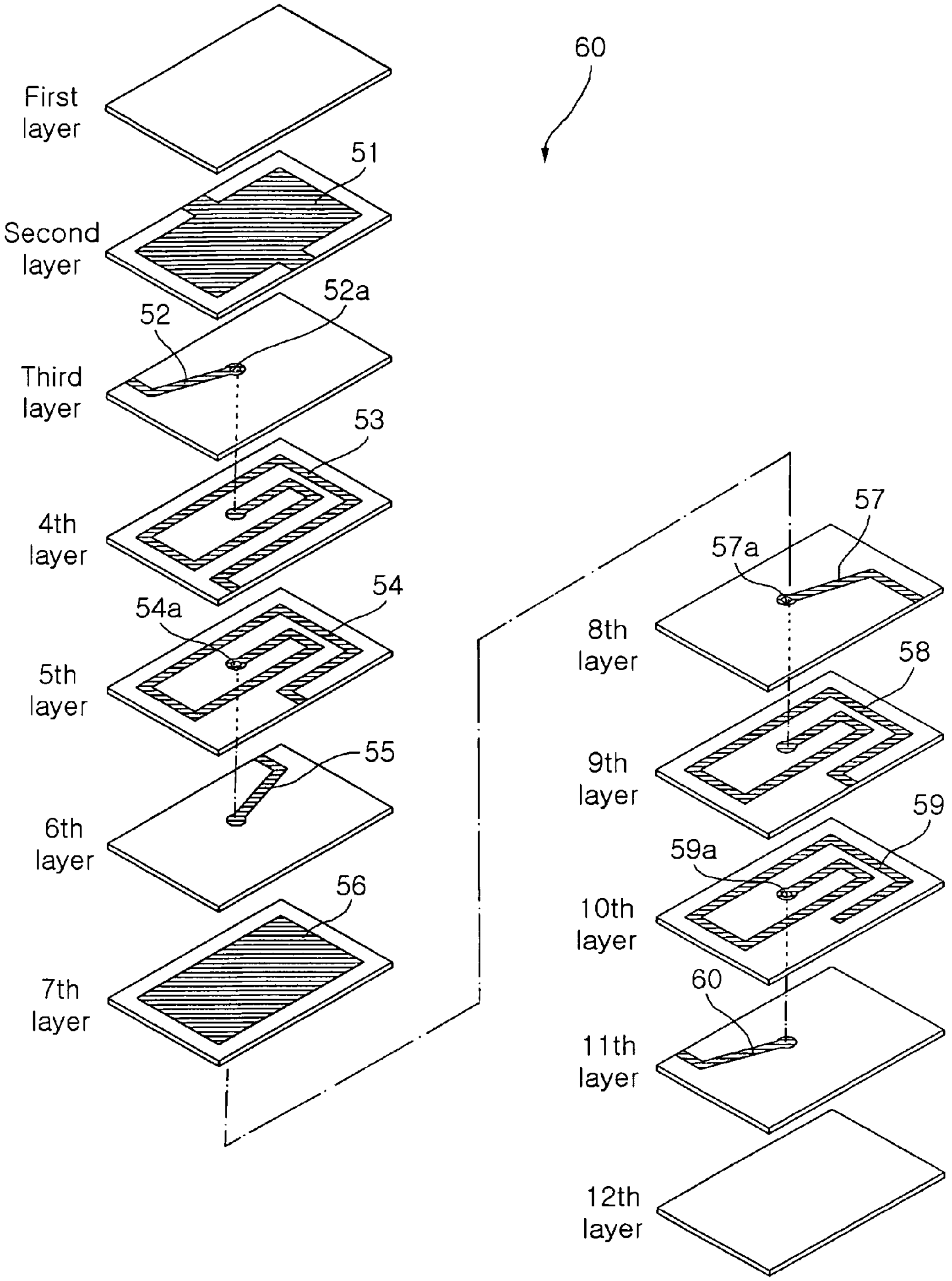
FIG. 6 is an exploded perspective view illustrating a laminated balun transformer according to a second embodiment of the present invention.

FIGS. 5 and 6 are exploded perspective views illustrating a laminated balun transformer according to embodiments of the present invention.

First, a laminated balun transformer according to a first embodiment of the present invention is implemented by forming a non-ground electrode pattern for an electric shield between two pairs of strip lines, each pair composing a coupler, in laminating four λ/4 strip lines.

In more detail, referring to FIG. 5, a laminated balun transformer 50 according to the first embodiment of the present invention includes conductive patterns formed from top to bottom.

There is no conductive pattern on a first dielectric sheet layer, which corresponds to the uppermost layer of the laminated balun transformer 50.

A first ground electrode 51 having a rectangular shape and connected to the external electrodes 43 and 46 for a ground for providing a reference line of an electric shield and an impedance in an upward direction is formed on a second dielectric sheet layer below the first dielectric sheet layer.

A first lead electrode 52 having one end connected to the external electrode 42 for non-connection and the other end at which a via hole 52*a* is formed for an electrical connection is formed on a third dielectric sheet layer below the second dielectric sheet layer.

A first strip line 53 having a spiral or meandering shape and having one end connected to the via hole 52*a* of the first lead electrode 52 and the other end connected to the external electrode 45 of the unbalanced signal is printed on a fourth dielectric sheet layer.

A third strip line 54 having a spiral or meandering shape formed in parallel with the first strip line 53 and having one end connected to the external electrode 46 for a ground and the other end, at which a via hole 54*a* connected to a lower layer is formed, is formed on a fifth dielectric sheet layer.

A second lead electrode 55 having one end connected to the via hole 54*a* and the other end connected to the external electrode 44 for the balanced signals for electrically connecting the other end of the third strip line 54 to the external electrode 44 of the balanced signals is formed on a sixth dielectric sheet layer.

A non-ground electrode 56 having a rectangular shape covering the entire surface of the dielectric sheet in order to electrically shield the first and third strip lines 53 and 54 and a lower layer is formed on a seventh dielectric sheet layer.

A third lead electrode 57 having one end at which a via hole 57*a* connected to a lower layer is formed and the other end connected to the external electrode 47 of the balanced signals is formed on an eighth dielectric sheet layer. A fourth strip line 58 having a spiral or meandering shape and having one end connected to the via hole 57*a* and the other end connected to the external electrode 46 of a ground is formed on a ninth dielectric sheet layer. A second strip line 59 having a spiral or meandering shape formed in parallel with the fourth strip line 58 and having one end at which the via hole 59*a* is formed and the other end opened is formed on a tenth dielectric sheet layer. A fourth lead electrode 60 having one end connected to the via hole 59*a* of the second strip line 59 and the other end connected to the external electrode 42 for non-connection is formed on an eleventh dielectric sheet layer. A second ground electrode 61 having a rectangular shape and connected to the external electrodes 43 and 46 for a ground is formed on a twelfth dielectric sheet layer. Finally, a thirteenth layer is a dielectric sheet with no conductive pattern.

In the laminated balun transformer as constructed above, the first strip line 53, the second strip line 59, the third strip line 54 and the fourth strip line 58 correspond to a signal line 14, a signal line 15, a signal line 16 and a signal line 17 in the equivalent circuit of FIG. 1, respectively.

As described above, the first and third strip lines 53 and 54 and the second and fourth strip lines 59 and 59 act as a coupler, respectively. At this time, the non-ground electrode 56 shields electromagnetic coupling between the coupler by the first and third strip lines 53 and 54 and the coupler by the second and fourth strip lines 59 and 58. In addition, the first ground electrode 51 and the second ground electrode 61 are positioned at the upper and lower portions of the dielectric block 41 such that internal strip lines 53, 54, 58 and 59 act as an impedance, respectively.

The first strip line 53 and the third strip line 54 are arranged in parallel between the first ground electrode 51 and the non-ground electrode 56, and the second strip line 59 and the fourth strip line 58 are arranged in parallel between the non-ground electrode 56 and the second ground electrode 61. At this time, the third strip line 54 and the fourth strip line 59 must be vertically arranged with the non-ground electrode 56 therebetween.

Accordingly, although the non-ground electrode 56 is not grounded, it has a zero potential by forming conductive metal between the third strip line 54 and the fourth strip line 58 for generating a signal having an opposite phase. Accordingly, the non-ground electrode 56 acts as a ground electrode without necessitating connection to the external electrodes 43 and 46 for a ground to generate the zero potential forcibly.

In addition, insertion loss in the operation frequency band can be further reduced by forming the non-ground electrode 56 between the third and fourth strip lines 54 and 58.

Figure 3:
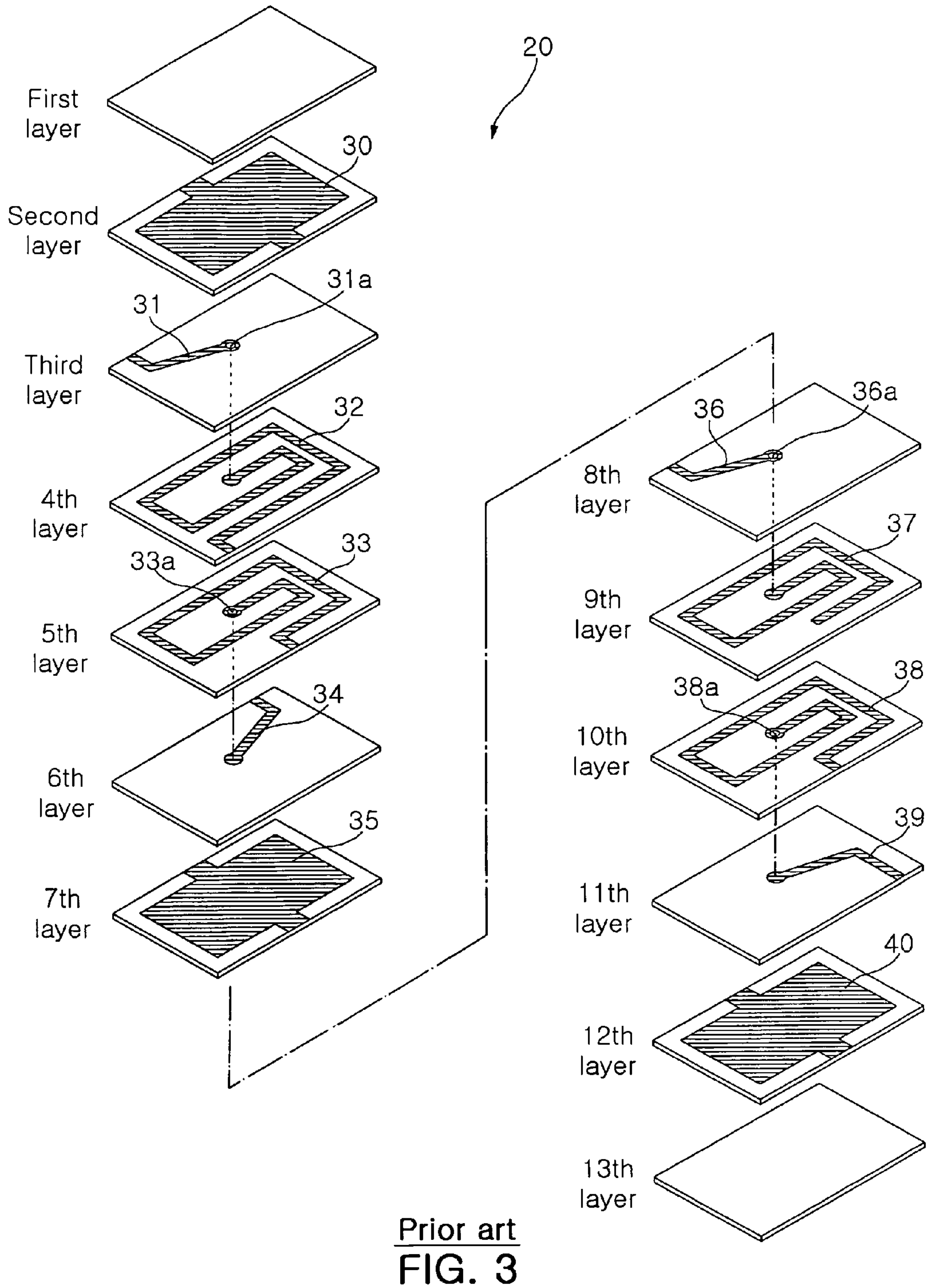
Prior art FIG. 3
FIG. 3 is an exploded perspective view illustrating the internal structure of the conventional laminated balun transformer of FIG. 2.

Compared to the conventional structure as shown in FIG. 3, an improvement of the insertion loss over 0.5 Db is shown.

Accordingly, the operational characteristics of the laminated balun transformer according to this embodiment of the present invention can be improved without increasing the number of processes or laminations.

In a laminated balun transformer according to a second embodiment of the present invention, in order to reduce the thickness of the balun transformer without any deterioration of its characteristic, a ground electrode positioned at a lower portion, i.e., in a mounting direction, of the ground electrodes formed in the dielectric block is removed, and the ground pattern of the substrate positioned on the mount surface of the balun transformer is used for the second ground electrode 61.

FIG. 6 is an exploded perspective view illustrating a dielectric block of a laminated balun transformer according to a second embodiment of the present invention.

The laminated balun transformer as shown in FIG. 6 has the same structure as FIG. 5 except that the second ground electrode 61 formed on a lower layer in a mount direction in FIG. 5 is removed, when compared to the laminated balun transformer of FIG. 5.

In more detail, the laminated balun transformer 60 according to the second embodiment includes a first ground electrode 51 having a rectangular shape and connected to the external electrodes 43 and 46 for a ground for providing a reference line of an electric shield and an impedance in an upward direction, a first lead electrode 52 having one end connected to the external electrode 42 for non-connection and the other end at which a via hole 52*a* is formed for an electrical connection, a first strip line 53 having a spiral or meandering shape and having one end connected to the via hole 52*a* of the first lead electrode 52 and the other end connected to the external electrode 45 of the unbalanced signal, a third strip line 54 having a spiral or meandering shape formed in parallel with the first strip line 53 and having one end connected to the external electrode 46 for a ground and the other end at which a via hole 54*a* connected to a lower layer is formed, a second lead electrode 55 having one end connected to the via hole 54*a* and the other end connected to the external electrode 44 for the balanced signals for electrically connecting the other end of the third strip line 54 to the external electrode 44 of the balanced signals, a non-ground electrode 56 covering an entire surface of the dielectric sheet and formed at a position below the third strip line 54 in such a manner that the non-ground electrode 56 is not connected to the external electrodes 42 to 47, a third lead electrode 57 formed below the non-ground electrode 56 and having one end at which a via hole 57*a* connected to a lower layer is formed and the other end connected to the external electrode 47 of the balanced signals, a fourth strip line 58 formed below the non-ground electrode 56 and having one end connected to the via hole 57*a* and the other end connected to the external electrode 46 of a ground, a second strip line 59 having a spiral or meandering shape formed in parallel with the fourth strip line 58 and having one end at which the via hole 59*a* is formed and the other end opened, and a fourth lead electrode 60 having one end connected to the via hole 59*a* of the second strip line 59 and the other end connected to the external electrode 42 for non-connection.

Since the second ground electrode 61 is removed in the laminated balun transformer according to the second embodiment, the thickness of the laminated balun transformer is reduced by an amount corresponding to the height from the second ground electrode 61 to the bottom layer. In laminating the conductive patterns in the dielectric block 41, particularly, a certain distance between vertically adjacent conductive patterns must be maintained. Accordingly, a certain distance between the second strip line 59 and the second ground electrode 61 is required and the second ground electrode 61 must be spaced apart by a certain distance from a mounting surface. At this time, by removing the second ground electrode 61, the thickness from the second ground electrode 61 to the bottom surface of the dielectric block can be removed.

At this time, the bottom layer of the dielectric block 60, which is the mount surface having a ground pattern typically formed thereon, is bonded to a printed circuit board. Accordingly, when the laminated balun transformer of the present invention is mounted at a mounting position on the printed circuit board, the ground pattern of the mount surface acts as a ground electrode, showing a certain impedance characteristic, without the second ground electrode 61. As a result, the operational characteristic of the laminated balun transformer can be maintained. The operational characteristic of the laminated balun transformer 60 according to the second embodiment measured after it is mounted on the printed circuit board shows little difference from that of the conventional laminated balun transformer. Moreover, the insertion loss is further reduced by 0.5 dB or more, compared to the conventional laminated balun transformer.

Accordingly, as shown in FIG. 6, it can be seen that the laminated balun transformer implemented according to the present invention has no variation of the operational characteristic.

As apparent from the above description, the laminated balun transformer has an advantage in that the operational characteristic, particularly, the insertion loss of the transformer, can be improved without the increase of the number of laminations or processes, and moreover, the thickness of the transformer can be reduced without any deterioration of the operational characteristic.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A laminated balun transformer including a dielectric block formed by laminating a plurality of dielectric sheets, and a plurality of external electrodes formed on the outer sides of the dielectric block and used for a ground, input/output of the unbalanced signal, input/output of first and second balanced signals, and non-connection, wherein the dielectric block includes:

an internal ground electrode formed on a lower layer spaced apart by a certain distance from the top layer of the dielectric block, the internal ground electrode being connected to the external electrode for a ground;

a first strip line formed on a lower layer below the internal ground electrode and having one end connected to the external electrode for input/output of the unbalanced signal;

a second strip line formed on a lower layer below the internal ground electrode and having one end connected to the other end of the first strip line, the other end of the second strip line being opened;

a third strip line formed in parallel with the first strip line on a lower layer below the internal ground electrode and having one end connected to the external electrode for a ground and the other end connected to the external electrode for input/output of the first balanced signal; and a fourth strip line formed in parallel with the second strip line on a lower layer below the internal ground electrode and having one end connected to the external electrode for a ground and the other end connected to the external electrode for input/output of the second balanced signal, wherein the bottom layer of the dielectric block is mounted on a ground pattern of a substrate, the first to fourth strip lines are formed on different layers in the dielectric block, and the dielectric block further includes a non-ground electrode made of a conductive metal material and formed on a layer between the third strip line and the fourth strip line in parallel with each other for forming an electrical shielding between the first and third strip lines and the second and fourth strip lines.

2. The laminated balun transformer as set forth in claim 1, wherein the first to fourth strip lines have a spiral or meandering shape.

3. A laminated balun transformer including a dielectric block formed by laminating a plurality of dielectric sheets, and a plurality of external electrodes formed on the outer sides of the dielectric block and used for a ground, input/output of the unbalanced signal, input/output of first and second balanced signals, and non-connection, wherein the dielectric block includes;

an internal ground electrode formed on a lower layer spaced apart by a certain distance from the top layer of the dielectric block, the internal ground electrode being connected to the external electrode for a ground;

a first strip line formed on a lower layer below the internal ground electrode and having one end connected to the external electrode for input/output of the unbalanced signal;

a second strip line formed on a lower layer below the internal ground electrode and having one end connected to the other end of the first strip line, the other end of the second strip line being opened;

a third strip line formed in parallel with the first strip line on a lower layer below the internal ground electrode and having one end connected to the external electrode for a ground and the other end connected to the external electrode for input/output of the first balanced signal; and a fourth strip line formed in parallel with the second strip line on a lower layer below the internal ground electrode and having one end connected to the external electrode for a ground and the other end connected to the external electrode for input/output of the second balanced signal, wherein the bottom layer of the dielectric block is mounted on a ground pattern of a substrate, the first to fourth strip lines are formed on different layers in the dielectric block, and the first strip line is electrically connected to the second strip line though the external electrode for non-connection.

4. The laminated balun transformer as set forth in claim 3, wherein the first to fourth strip lines have a spiral shape.

5. The laminated balun transformer as set forth in claim 3, wherein the first to fourth strip lines have a meandering shape.

6. A laminated balun transformer including a dielectric block formed by laminating a plurality of dielectric sheets, and a plurality of external electrodes formed on the outer sides of the dielectric block and used for a ground, input/output of the unbalanced signal, input/output of first and second balanced signals, and non-connection, wherein the dielectric block includes:

an internal ground electrode formed on a lower layer spaced apart by a certain distance from the top layer of the dielectric block, the internal ground electrode being connected to the external electrode for a ground and formed to shield electric coupling in an upward direction;

a first strip line formed on a lower layer below the internal ground electrode and having both ends connected respectively to the external electrode for non-ground and the external electrode for input/output of the unbalanced signal;

a third strip line formed in parallel with the first strip line on an adjacent layer above or under the first strip line in a downward direction of the internal ground electrode and having both ends connected respectively to the external electrode for a ground and the external electrode for input/output of the first balanced signal;

a fourth strip line formed on a lower layer below the internal ground electrode and having both ends connected respectively to the external electrode for ground and the external electrode for the second balanced signal;

a second strip line formed in parallel with the fourth strip line on a lower layer below the internal ground electrode of the dielectric block and having one end connected to the external electrode for non-connection and the other end opened; and a non-ground electrode made of a conductive metal material and formed on an intermediate layer between the third strip line and the fourth strip line.

7. The laminated balun transformer as set forth in claim 6, wherein the bottom layer of the dielectric block is bonded to a ground pattern of a substrate to be used as a bottom ground electrode.

8. The laminated balun transformer as set forth in claim 6, wherein the dielectric block further includes;

a first lead electrode for connecting the first strip line to the external electrode for non-connection, the first lead electrode being formed on an internal layer of the dielectric block and having one end connected to the external electrode for non-connection and the other end electrically connected to one end of the first strip line through a via hole;

a second lead electrode for connecting the third strip line to the external electrode for input/output of the balanced signals, the second lead electrode being formed on an internal layer of the dielectric block and having one end electrically connected to the third strip line through a via hole and the other end connected to the external electrode for input/output of the balanced signals;

a third lead electrode for connecting the fourth strip line to the external electrode for input/output of the second balanced signal, the third lead electrode being formed on an internal layer of the dielectric block and having one end electrically connected to the fourth strip line through a via hole and the other end connected to the external electrode for input/output of the second balanced signal; and a fourth lead electrode for connecting the second strip line to the external electrode for non-connection, the fourth lead electrode being formed on an internal layer of the dielectric block and having one end electrically connected to the second strip line through a via hole and the other end connected to the external electrode for input/output of the balanced signals.

9. The laminated balun transformer as set forth in claim 6, wherein the first to fourth strip lines have a spiral or meandering shape.

* * * * *